US008992684B1

(12) United States Patent
Kovalenkov et al.

(10) Patent No.: US 8,992,684 B1
(45) Date of Patent: Mar. 31, 2015

(54) EPITAXY REACTOR INTERNAL COMPONENT GEOMETRIES FOR THE GROWTH OF SUPERIOR QUALITY GROUP III-NITRIDE MATERIALS

(71) Applicant: Ostendo Technologies, Inc., Carlsbad, CA (US)

(72) Inventors: Oleg Kovalenkov, Gaithersburg, MD (US); Vitali Soukhoveev, Gaithersburg, MD (US); Alexander Syrkin, Montgomery Villiage, MD (US); Vladimir Sizov, Gaithersburg, MS (US)

(73) Assignee: Ostendo Technologies, Inc., Carlsbad, CA (US)

( * ) Notice: Subject to any disclaimer, the term of this patent is extended or adjusted under 35 U.S.C. 154(b) by 37 days.

(21) Appl. No.: 13/918,643

(22) Filed: Jun. 14, 2013

Related U.S. Application Data (60) Provisional application No. 61/660,607, filed on Jun. 15, 2012.

(51) Int. Cl.
 *C23C 16/448* (2006.01)
 *C23C 16/455* (2006.01)
 *C23C 16/34* (2006.01)
 *C30B 25/14* (2006.01)
 *C30B 35/00* (2006.01)

(52) U.S. Cl.
 CPC ............. *C30B 35/00* (2013.01); *C30B 25/14* (2013.01)
 USPC . 118/715; 118/726; 427/255.23; 427/255.28; 427/255.394; 117/93

(58) Field of Classification Search
 USPC ............. 118/715, 726; 427/255.23, 255.28, 427/255.394; 117/93
 See application file for complete search history.

(56) References Cited

U.S. PATENT DOCUMENTS

| 4,144,116 A | 3/1979 | Jacob et al. |
| 6,218,269 B1 | 4/2001 | Nikolaev et al. |
| 6,528,394 B1 | 3/2003 | Lee |
| 6,559,038 B2 | 5/2003 | Nikolaev et al. |
| 6,613,143 B1 | 9/2003 | Melnik et al. |
| 6,632,725 B2 | 10/2003 | Trassoudaine et al. |
| 6,656,272 B2 | 12/2003 | Tsvetkov et al. |
| 6,656,285 B1 | 12/2003 | Melnik et al. |
| 6,660,083 B2 | 12/2003 | Tsvetkov et al. |
| 6,890,809 B2 | 5/2005 | Karpov et al. |
| 6,955,719 B2 | 10/2005 | Dmitriev et al. |
| 6,969,426 B1 * | 11/2005 | Bliss et al. ............ 117/104 |
| 7,220,324 B2 | 5/2007 | Baker et al. |

(Continued)

OTHER PUBLICATIONS

Amano, H., et al., "Metalorganic vapor phase epitaxial growth of a high quality GaN film using an AlN buffer layer", *Applied Physics Letters*, vol. 48, No. 5, (Feb. 3, 1986), pp. 353-355.

(Continued)

*Primary Examiner* — Evan Pert
(74) *Attorney, Agent, or Firm* — Blakely Sokoloff Taylor & Zafman LLP (57) ABSTRACT

The geometry of transition from cylindrical to rectangular shape through the conical part in hydride vapor phase epitaxial (HVPE) systems for deposition of III-nitride films is disclosed. It is used to ensure the laminar gas flow inside the growth zone of the system. For the velocity of flow within the atmospheric pressure reactor to be sufficient, the precursors are injected through the narrow diameter tubing injectors. The quartz reactor geometry is introduced to control the transition from jet to laminar flow.

10 Claims, 6 Drawing Sheets

(56) References Cited

U.S. PATENT DOCUMENTS

| | | | |
|---|---|---|---|
| 7,276,121 B1* | 10/2007 | Bliss et al. | 118/715 |
| 7,279,047 B2 | 10/2007 | Melnik et al. | |
| 7,621,999 B2 | 11/2009 | Koukitu et al. | |
| 7,670,435 B2 | 3/2010 | Tsvetkov et al. | |
| 7,727,333 B1 | 6/2010 | Syrkin et al. | |
| 7,976,631 B2* | 7/2011 | Burrows et al. | 118/715 |
| 8,138,069 B2 | 3/2012 | Melnik et al. | |
| 8,840,726 B2* | 9/2014 | Li et al. | 118/715 |
| 8,841,118 B2* | 9/2014 | Robinson et al. | 435/287.3 |
| 2002/0022286 A1 | 2/2002 | Nikolaev et al. | |
| 2002/0155713 A1 | 10/2002 | Tsvetkov et al. | |
| 2002/0177312 A1 | 11/2002 | Tsvetkov et al. | |
| 2003/0013222 A1 | 1/2003 | Trassoudaine et al. | |
| 2003/0049898 A1 | 3/2003 | Karpov et al. | |
| 2004/0137657 A1 | 7/2004 | Dmitriev et al. | |
| 2005/0056222 A1 | 3/2005 | Melnik et al. | |
| 2006/0205199 A1 | 9/2006 | Baker et al. | |
| 2008/0063584 A1 | 3/2008 | Koukitu et al. | |
| 2010/0012948 A1 | 1/2010 | Usikov et al. | |
| 2010/0215854 A1 | 8/2010 | Burrows et al. | |
| 2010/0273318 A1 | 10/2010 | Melnik et al. | |
| 2012/0156863 A1 | 6/2012 | Melnik et al. | |

OTHER PUBLICATIONS

Ambacher, O. , "Growth and applications of Group III-nitrides", *J. Phys. D: Appl. Phys.*, vol. 31, (1998), pp. 2653-2710.

Baker, Troy J., et al., "Characterization of Planar Semipolar Gallium Nitride Films on Sapphire Substrates", *Japanese Journal of Applied Physics*, vol. 45, No. 6, (2006), pp. L154-L157.

Bohnen, Tim , et al., "Enhanced growth rates and reduced parasitic deposition by the substitution of $Cl_2$ for HCl in GaN HVPE", *Journal of Crystal Growth*, vol. 312, (2010), pp. 2542-2550.

Chengyan, Gu , et al., "Design of a three-layer hot-wall horizontal flow MOCVD reactor", *Journal of Semiconductors*, vol. 33, No. 9, (Sep. 2012), pp. 093005-1 to 093005-5.

Craven, Michael D., et al., "Characterization of a-Plane GaN/ (Al,Ga)N Multiple Quantum Wells Grown via Metalorganic Chemical Vapor Deposition", *Japanese Journal of Applied Physics*, vol. 42, Part 2, No. 3A, (Mar. 1, 2003), pp. L235-L238.

Detchprohm, T. , et al., "The growth of thick GaN film on sapphire substrate by using ZnO buffer layer", *Journal of Crystal Growth*, vol. 128, (1993), pp. 384-390.

Dwikusuma, F. , et al., "X-ray photoelectron spectroscopic study on sapphire nitridation for GaN growth by hydride vapor phase epitaxy: Nitridation mechanism", Journal of Applied Physics, vol. 94, No. 9, (Nov. 1, 2003), pp. 5656-5664.

Eastman, Lester F., et al., "The Toughest Transistor Yet", IEEE Spectrum, vol. 39, No. 5, (May 2002), pp. 28-33.

Fahle, D. , et al., "Deposition control during GaN MOVPE", *Materials of CS MANTECH Conference, May 13-16, 2013, New Orleans, Louisiana, USA*, vol. 12, (2013), pp. 399-402.

Fahle, D. , et al., "HCl-assisted growth of GaN and AlN", *Journal of Crystal Growth*, vol. 370, (2013), pp. 30-35.

Gu, Shulin , et al., "The impact of initial growth and substrate nitridation on thick GaN growth on sapphire by hydride vapor phase epitaxy", *Journal of Crystal Growth*, vol. 231, (2001), pp. 342-351.

Kang, Sang W., et al., "Prevention of In droplets formation by HCl addition during metal organic vapor phase epitaxy of InN", *Applied Physics Letters*, vol. 90, (2007), pp. 161126-1 to 161126-3.

Kim, S. T., et al., "Growth and Properties of Freestanding GaN Substrates by HVPE Using an AlN Buffer Layer Deposited on Si", *Journal of the Korean Physical Society*, vol. 33, No. 6, (Dec. 1998), pp. 736-740.

Manasevit, H. M., et al., "The Use of Metalorganics in the Preparation of Semiconductor Materials, IV. The Nitrides of Aluminum and Gallium", *J. Electrochem. Soc.*, vol. 118, No. 11, (1971), pp. 1864-1868.

Maruska, H. P., et al., "The Preparation and Properties of Vapor-Deposited Single-Crystal-Line GaN", *Applied Physics Letters*, vol. 15, No. 10, (Nov. 15, 1969), pp. 327-329.

Mastro, M. A., et al., "Influence of polarity on GaN thermal stability", *Journal of Crystal Growth*, vol. 274, (2005), pp. 38-46.

Mastro, M. A., et al., "Thermal Stability of MOCVD and HVPE GaN Layers in $H_2$, HCl, $NH_3$ and $N_2$", *phys. stat. sol. (a)*, vol. 188, No. 1, (2001), pp. 467-471.

Nakamura, Shuji , "GaN Growth Using GaN Buffer Layer", *Japanese Journal of Applied Physics*, vol. 30, No. 10A, (Oct. 1991), pp. L1705-L1707.

Nakamura, Shuji , et al., "The Blue Laser Diode, The Complete Story", Springer-Verlag Berlin Heidelberg New York, (2000), pp. 170-175 & 206-214.

Ng, H. M., "Molecular-beam epitaxy of $GaN/Al_xGa_{1-x}N$ multiple quantum wells on R-plane (1012) sapphire substrates", *Applied Physics Letters*, vol. 80, No. 23, (Jun. 10, 2002), pp. 4369-4371.

Nishida, T. , et al., "Ten-Milliwatt Operation of an AlGaN-Based Light Emitting Diode Grown on GaN Substrate", *phys. stat. sol. (a)*, vol. 188, No. 1, (2001), pp. 113-116.

Richter, E. , et al., "Reactor and growth process optimization for growth of thick GaN layers on sapphire substrates by HVPE", *Journal of Crystal Growth*, vol. 277, (2005), pp. 6-12.

Romanov, A. E., et al., "Strain-induced polarization in wurtzite III-nitride semipolar layers", *Journal of Applied Physics*, vol. 100, (2006), pp. 023522-1 to 023522-10.

Safvi, S. A., et al., "Optimization of Reactor Geometry and Growth Conditions for GaN Halide Vapor Phase Epitaxy", *Mat. Res. Soc. Symp. Proc.*, vol. 423, (1996), pp. 227-232.

Segal, A. S., et al., "Surface chemistry and transport effects in GaN hydride vapor phase epitaxy", *J. Crystal Growth*, vol. 270, (2004), pp. 384-395.

Waltereit, P. , et al., "Nitride semiconductors free of electrostatic fields for efficient white light-emitting diodes", *Nature*, vol. 406, (Aug. 24, 2000), pp. 865-868.

Wang, F. , et al., "Influences of mask width, fill factor, HCl addition and C doping on wing tilts in the epitaxial laterally overgrown GaN films by hydride vapor phase epitaxy", *Applied Physics Letters*, vol. 80, No. 25, (Jun. 24, 2002), pp. 4765-4767.

Weyers, Markus , et al., "GaN substrates by HVPE", *Proc of SPIE*, vol. 6910, (2008), pp. 691001-1 to 691001-10.

Xiangqian, Xiu , et al., "Effect of Additional HCl and Substrate Nitridation on GaN Films Grown by HVPE", *Chinese Journal of Semiconductors*, vol. 24, No. 11, (Nov. 2003), pp. 1171-1175.

Xiu, X. Q., et al., "Effect of Additional HCl on the Surface Morphology of High Quality GaN on Sapphire by HVPE", Mat. Res. Soc. Symp. Proc., vol. 693, (2002), pp. 135-139.

Yoshida, S. , et al., "Epitaxial growth of GaN/AlN heterostructures", *J. Vac. Sci. Technol. B*, vol. 1, No. 2, (Apr.-Jun. 1983), pp. 250-253.

Yoshida, S. , et al., "Improvements on the electrical and luminescent properties of reactive molecular beam epitaxially grown GaN films by using AlN-coated sapphire substrates", *Appl. Phys. Lett.*, vol. 42, No. 5, (Mar. 1, 1983), pp. 427-429.

Yoshida, Takehiro , et al., "Ultrahigh-speed growth of GaN by hydride vapor phase epitaxy", *Phys. Status Solidi C*, vol. 8, Issue 7-8, (2011), pp. 2110-2112.

* cited by examiner

EPITAXY REACTOR INTERNAL COMPONENT GEOMETRIES FOR THE GROWTH OF SUPERIOR QUALITY GROUP III-NITRIDE MATERIALS

CROSS-REFERENCE TO RELATED APPLICATIONS

This application claims the benefit of U.S. Provisional Patent Application No. 61/660,607 filed Jun. 15, 2012.

BACKGROUND OF THE INVENTION

1. Field of the Invention

The present invention relates generally to epitaxial growth systems for production of semiconductor materials and devices, in particular. More specifically, the invention relates to the design of hydride vapor phase epitaxy (HVPE) growth systems and reactors, the design of internal components of HVPE growth systems and reactors, and HVPE-based processes for growth of group III-nitride materials and devices that can be used in optoelectronics as well as in high-power high-frequency electronics.

2. Prior Art

This application references a number of patents, applications and/or publications. Each of these patents, applications and/or publications is incorporated by reference herein.

The usefulness of gallium nitride (GaN), aluminum nitride, indium nitride, and their ternary and quaternary compounds (AlGaN, InGaN, AlInGaN), collectively known as "group III-nitrides," has been well established for fabrication of visible and ultraviolet optoelectronic devices and high-power electronic devices (see T. Nishida and N. Kobayashi, Phys. Stat. Sol. (a), 188 (1), 113 (2001); S. Nakamura, G. Fasol, and S. J. Pearton, *The Blue Laser Diode*. New York: Springer, 2000; and L. F. Eastman and U. K. Mishra, IEEE Spectrum, 39 (5), 28 (2002)). These devices are typically grown epitaxially by growth techniques including molecular beam epitaxy (MBE) (see S. Yoshida, S. Misawa and S. Gonda, Appl. Phys. Lett. 42 (1983), pp. 427), metalorganic chemical vapor deposition (MOCVD) (see H. M. Manasevit, F. M. Erdmann and W. I. Simpson, J. Electrochem. Soc. 118 (1971), pp. 1864), or hydride vapor phase epitaxy (HVPE) (see H. P. Maruska and J. J. Tietjin, Appl. Phys. Lett. 15 (1969), pp. 327). Among these three techniques, HVPE has the advantage of a high growth rate, which is more than a factor of ten higher than those inherent to MOCVD or MBE, making HVPE most preferable for the growth of thick III-Nitride films, templates, free-standing substrates, and bulk crystals.

During these deposition processes, a group III-nitride is grown upon a substrate or template consisting of, but not limited to, sapphire, silicon, silicon carbide, magnesium aluminate spinel, gallium nitride, aluminum nitride, aluminum-gallium nitride alloys, indium nitride, and/or lithium aluminate. A template shall be understood to be a substrate of one of the preceding materials coated with a layer of group III-nitride material. For the purposes of this invention, the terms "substrate" and "template" will be used interchangeably, though one skilled in the art will recognize that slightly different growth chemistries are required to optimize a group III-nitride deposition process for each. The differences in required chemistries are independent, however, of the implementation of the invention as described below.

Group III-nitride-based optoelectronic and electronic device performance to a great extent depends on the structural perfection of the starting template or substrate material. Due to the lack of widespread availability and high cost of native substrates (a substrate consisting of the same group III-nitride as the group III-nitride device structure), it is common for group III-nitride-based devices to be grown upon templates. These templates most commonly consist of group III-nitride layers on sapphire, silicon or silicon carbide substrates. Most commonly, the templates for visible optoelectronic devices consist of GaN thin films on sapphire or silicon substrates. As such, while this disclosure will refer principally to "GaN templates," herein, such references incorporate all templates that incorporate group III-nitride films regardless of composition. As the structural quality of the template increases, the performance of the device grown on it tends to improve. It is well known that quality of many orientations of group III-nitride templates can be improved by increasing thickness of the GaN epilayer. In thick epilayers defect density can be reduced down to the level well suited even for the highly delicate device structures.

Since hydride vapor phase epitaxy provides the highest possible rate for the GaN growth, HVPE has emerged as a primary technique for the GaN template production. High growth rates in the vapor phase can be achieved at high operating gas flows that continuously resupply group III and group V precursor molecules to the surface of the growing film. However, high gas flow rates require that special attention be paid to the gas flow distribution to provide high quality homogeneous growth.

US Patent Application Publication No. 2010/0215854 discloses a method and apparatus that may be utilized in HVPE deposition processes. This application discloses two passages/channels that introduce the metal and nitrogen containing precursor gases into the HVPE growth chamber. These passages may be separated spatially in an effort to prevent mixing of the metal-containing and nitrogen-containing precursor gases until they reach a substrate. An inert gas may also be flowed down through the passages to help maintain separation and limit reaction at or near the passages, thereby preventing unwanted deposition on the passages. Embodiments described in the patent application describe a showerhead design of the reactor for use in HVPE deposition. As it was found in S. A. Safvi, N. R. Perkins, M. N. Horton, A. Thon, D. Zhi, T. F. Kuech, Optimization of reactor geometry and growth conditions for GaN halide vapor phase epitaxy, Mat. Res. Soc. Symp. Proc. 423 (1996) 227-232, the main drawback of the showerhead design is the tight coupling between the deposition temperature and gas flow rate condition. In experiments in which the substrate holder was kept close to the inlet, the resulting epilayers have a dark polycrystalline patch in the center of the wafer, with a clear single crystalline film at the edges. It was noticed that the polycrystalline patch decreased in size and eventually disappeared as the substrate was moved further away from the inlet.

In the paper devoted to the modeling of the HVPE showerhead reactor (S. A. Safvi, N. R. Perkins, M. N. Horton, A. Thon, D. Zhi, T. F. Kuech, Optimization of reactor geometry and growth conditions for GaN halide vapor phase epitaxy, Mat. Res. Soc. Symp. Proc. 423 (1996) 227-232), the importance of raw materials species transport has been demonstrated. In particular, the computations have revealed an essential role of natural concentration convection in the species transport, resulting in large recirculation zones, vapor composition non-uniformity in the reactor, and, eventually, in a non-uniform instantaneous growth rate distribution over the wafer. Because of the non-uniform vapor composition, the GaN growth proceeds under modulated-flow conditions on the wafer periphery and at a nearly constant V/III ratio at the center of the wafer. This may result in variation of the materials properties both in depth and across the wafer.

BRIEF DESCRIPTION OF THE DRAWINGS

To clarify the description of the invention, its features are depicted in the following drawings. It has to be emphasized, however, that these drawings illustrate only typical embodiment of the invention and are not to be considered limiting of its scope.

FIGS. 6a and 6b illustrate a flow model of a portion of an epitaxy chamber including a nitrogen precursor insert within a growth liner, showing transition from circular to rectangular cross-section going from the source end to the growth zone. The computational fluid dynamic model of the gas flow shows transition of jet and turbulent flows to laminar flow prior to the growth zone.

DETAILED DESCRIPTION OF THE PREFERRED EMBODIMENTS

The present invention provides a "gas flow distribution unit," which generally describes the hardware through which process gases are injected into an epitaxy reactor, between source and growth zones of a hydride vapor phase epitaxy reactor for III-Nitride growth. The gas flow distribution unit includes a nitrogen precursor insert to transport a mix of a carrier gas and nitrogen precursors to the growth zone in the reactor separately from the group III-chloride injectors that transport a metal component of the growth reaction. The nitrogen precursor insert possesses a predominantly rectangular cross-section and low height-to-width ratio to reduce recirculation of the incoming flow and ensure laminar flow within the insert. Note that the article of interest is termed a "nitrogen precursor insert" because it is compatible with the use of a variety of nitrogen precursors including but not limited to ammonia, hydrazine and dihydrazine without fundamentally altering its design or function. However, due to the predominant use of ammonia as the nitrogen precursor in HVPE and MOCVD growth of group III-nitrides, the use of the word "ammonia" in this specification will be understood to generically represent any nitrogen precursor that is compatible with group III-nitride epitaxy.

Prior to mixing in the growth zone, the metal chloride and nitrogen precursors used in HVPE growth of III-nitrides are kept separated spatially to prevent premature parasitic chemical reactions from occurring. Additionally, due to the sufficiently long path arranged prior to the mixing, the separate precursors are delivered with the correct temperatures, flows and V-III ratio so that uniform mixing occurs in the growth zone. The spatial arrangement of the precursors' injection relative to each other and relative to the substrates is important to the growth of films with uniform growth rate, thickness, composition, morphology, and crystal quality. According to the present invention, the gas flow distribution unit makes such an arrangement possible.

Figure 1:
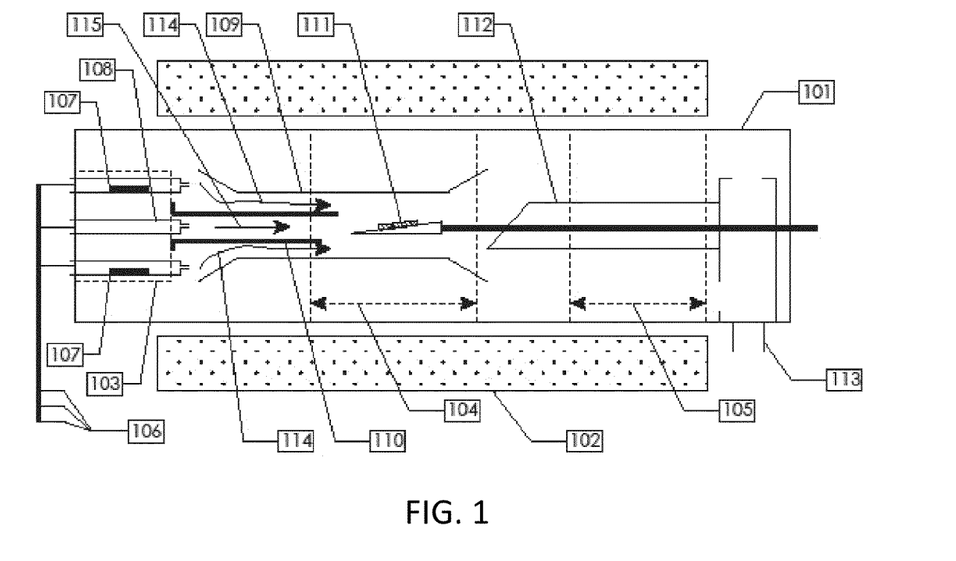
FIG. 1 is an illustration of a generic hot-walled epitaxy reactor containing the invention. The reactor geometry involves a predominantly horizontal gas flow path.

An axial cross-sectional illustration of one embodiment of an epitaxial growth reactor incorporating the invention is provided in FIG. 1. The growth system 100 includes growth chamber/reactor 101 represented by a horizontally configured containment tube surrounded by an external heater 102. While the external heater is illustrated as being external to the containment tube, implementing a "hot-walled" growth chamber design, the invention may be executed utilizing an internal heater in close proximity to the substrates (a "cold-walled" design). The embodiment also envisions a resistive tubular heater. However, other heating methods including but not limited to lamp and radio-frequency heating are compatible with the invention. The heater illustrated in FIG. 1 may consist of a single temperature zone, but more commonly will be divided into two to twenty independently controlled heating zones to provide for shaping of the thermal profile in the growth chamber.

Three "zones" are identified in FIG. 1 within the reactor 101 with dashed lines. Block 103 represents the "source zone" of the chamber, in which precursor gases are injected into the reactor via group Ill precursor injectors 107, nitrogen precursor injectors 108, and optionally carrier gas and dopant injectors (not shown). Precursor, carrier, and dopant species (collectively "process gases") originate from gas supply lines 106 that are connected to external sources such of chemicals including, but not limited to, nitrogen, argon, hydrogen chloride, hydrogen, ammonia, hydrazine, dihydrazine, hydrogen bromide, and hydrogen iodide. The process gases are transported from the source zone 103 towards the growth zone 104 via flow paths that are generally represented by the flow lines 114 and 115. In the particular embodiment 100, the process gases are predominantly confined within a growth liner 109 between the source and growth zones. Deposition of the group III nitride material occurs on a substrate 111 resting on a susceptor in the growth zone. The substrate may be optionally retracted into a dwell zone 105.

Of particular importance in the reactor 101 is the presence of the nitrogen precursor insert 110. The nitrogen precursor insert specifically separates the nitrogen precursor flows from the group III precursor flows until the gases approach the susceptor supporting the substrate 111. In this particular embodiment, the nitrogen precursor insert is designed such that the nitrogen precursor is confined within the insert while group III precursors flow in gaps between the nitrogen precursor insert and the surrounding components, e.g. the growth liner.

Figure 2:
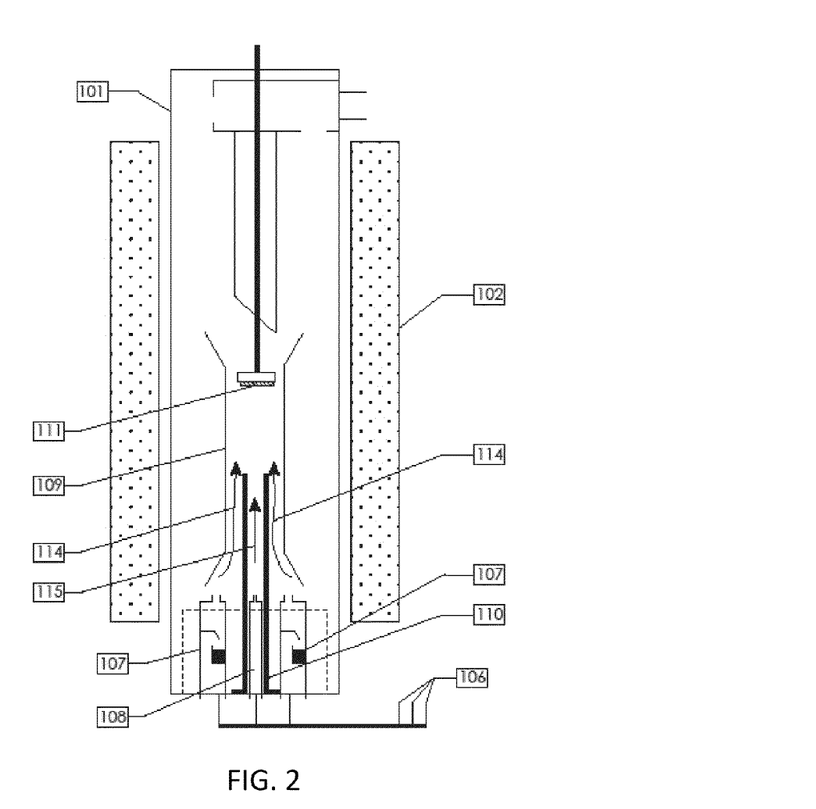
FIG. 2 is an illustration of a generic hot-walled epitaxy reactor containing the invention utilizing a predominantly vertical gas flow direction.

The reactor design illustrated in FIG. 1 possesses a predominantly horizontal flow path. However, other analogous reactor designs can be created with alternate flow directions. FIG. 2 illustrates a vertical epitaxy reactor configuration in which like numbered items can be similarly described as in FIG. 1.

Figure 3:
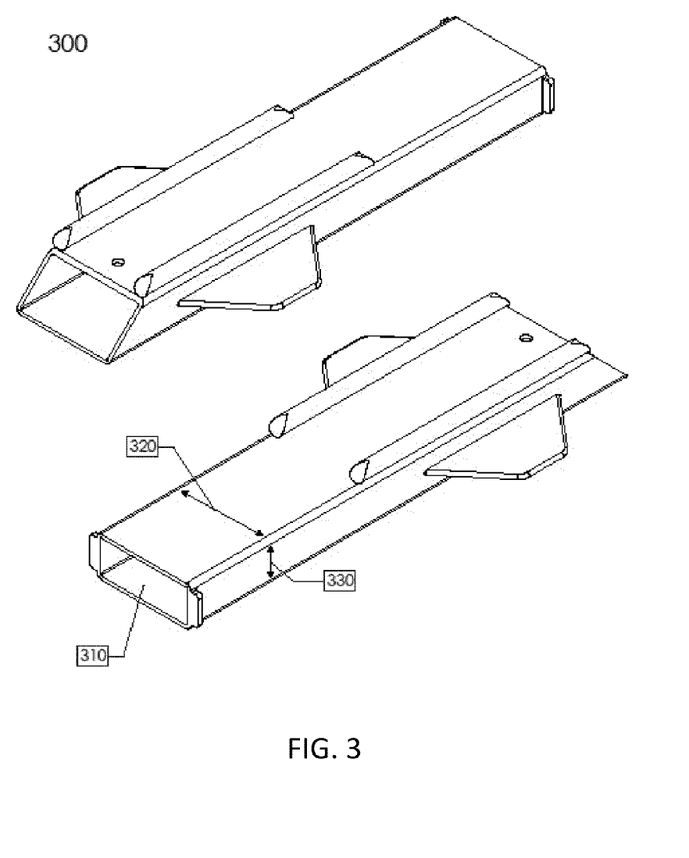
FIG. 3 is an illustration of an embodiment of a nitrogen precursor insert, providing two isometric views of the nitrogen precursor insert.

FIG. 3 illustrates two isometric views of an embodiment of the nitrogen precursor insert that was represented by block 110 in FIG. 1. The nitrogen precursor insert 300 is characterized by a predominantly rectangular cross section, represented by Block 310, having characteristic internal width 320 and internal height 330. The height-to-width ratio is thus characterized by the measurement of block 330 divided by the measurement of block 320. The nitrogen precursor insert is designed such that the nitrogen precursor flow leaving the liner is predominantly laminar and homogeneous to provide for uniform gas flow to the substrates. Additional geometric features of the nitrogen precursor insert 300 pictured in FIG. 3 are primarily related to assembly requirements in a specific epitaxy chamber, and are not fundamental to the invention. Such features or embellishments could include, but are not limited to, positioning holes and/or pins, support rails or bars, positioning wings, and flanges.

Figure 4:
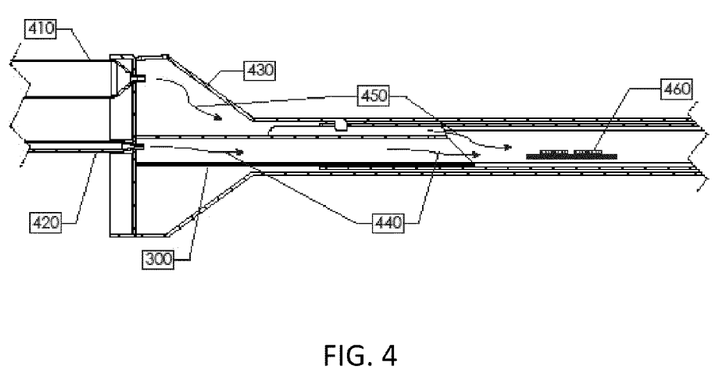
FIG. 4 is a cross-sectional view of a generic epitaxy chamber containing a nitrogen precursor insert.

FIG. 4 provides an axial cross-sectional view of the nitrogen precursor insert 300 integrated into the growth region of an epitaxy chamber. Block 410 represents one or more group III-chloride injectors that feed metal chlorides and carrier gases along flow lines represented by block 450. Block 420 represents one or more group V/nitrogen precursor injectors that feed a nitrogen precursor (typically ammonia) and carrier gas along flow lines represented by block 440. The nitrogen precursor insert 300 is located within a growth liner represented by block 430. The group III and group V precursor gases are directed toward one or more substrates, represented by block 460, located in the growth zone of the epitaxy chamber. The nitrogen precursor insert is designed such that the nitrogen precursor flow leaving the liner is predominantly laminar and homogeneous to provide for uniform gas flow to the substrates. In this particular embodiment, the nitrogen precursor insert is designed such that nitrogen precursor is confined within the insert while group III precursors flow in gaps between the nitrogen precursor insert and the surrounding components, e.g. the growth liner.

Figure 5:
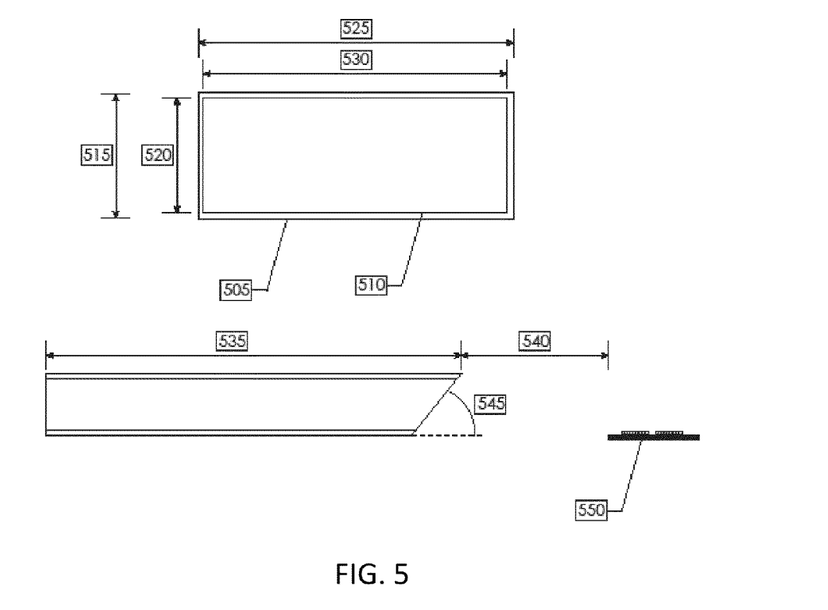
FIG. 5 shows a generic example of the geometry of nitrogen precursor insert and its relative spatial position to the wafer holder, which are both important to the delivery of an optimum precursor mixture to the wafer platen.

FIG. 5 provides a schematic detail of some of the relevant features of a generic nitrogen precursor insert in accordance with the invention. The nitrogen precursor insert possesses a predominantly rectangular cross-section characterized by an outer perimeter and an inner perimeter 510. The inner dimensions of the rectangular cross section of the nitrogen precursor insert are characterized by a height 520 and a width 530, the ratio of which is the height-to-width ratio described with respect to FIG. 3. Generally speaking, the outer dimensions 515 and 525 are less critical to the functionality of the nitrogen precursor insert 500 than the inner dimensions and depend on the geometry of surrounding components in the growth chamber. It should be noted that the description of a "height-to-width" ratio is most relevant to a predominantly horizontal flow geometry as illustrated in FIGS. 1 and 4. For a vertical configuration such as that shown in FIG. 2, the height-to-width ratio can be replaced by an "aspect ratio," with the requirement that the aspect ratio be greater than or less than, but not equal to, 1.00.

The length of the nitrogen precursor insert 535 along the flow direction of the growth chamber will generally depend on machine-specific geometry. However, the length 535 should be sufficient to enable the gas flow within the nitrogen precursor insert to be laminar rather than turbulent upon exiting the nitrogen precursor insert. The outlet of the nitrogen precursor insert may not be perpendicular to the gas flow direction, but rather is characterized by an angle 545 with respect to horizontal. This angle will typically vary between approximately 30° and 150°, more preferably being approximately 45° or 135°. The most preferable angle 545 will depend on specific growth chamber geometry, gas flow rates within and around the nitrogen precursor insert, and the separation distance 340 between the nitrogen precursor insert and the outlet. The nitrogen precursor insert with rectangular cross-section in conformance with this specification provides a uniform spreading of the nitrogen precursor gas over the substrates, resulting in better uniformity of the GaN layer parameters both within the batch and over the unit wafer.

According to preferred embodiments of the invention, the nitrogen precursor insert 100 illustrated in FIGS. 1-3 was used to grow thick GaN layers on sapphire substrates in a horizontal reactor. The height 320 and width 330 in the preferred embodiment were approximately 30 mm and 80 mm, respectively. The length 335 was optimized to minimize the standard deviation of the thickness of the GaN grown using the invention. It was found that a length of 500 mm coupled with a distance to the susceptor, represented by dimension block 340, of 100 mm provided optimal GaN thickness uniformity. In contrast, decreasing the length of the nitrogen precursor insert and increasing the separation distance 540 tended to decrease film uniformity due to an insufficient length over which to establish laminar flow and excess distance over which group III and group V precursors could mix before impinging on the substrates.

In at least one embodiment of the invention, the reactor is at least partially surrounded by a multi-temperature zone furnace as illustrated in FIG. 1. The reactor includes at least two, and preferably three zones: source zone, growth zone and dwell zone. The growth zone is maintained at an elevated temperature, preferably within the range of 1000° C. to 1100° C. This growth zone is preferably used for high quality crystalline growth. The growth rate can be varied along with variation of the temperature of the zone.

Figure 6A:
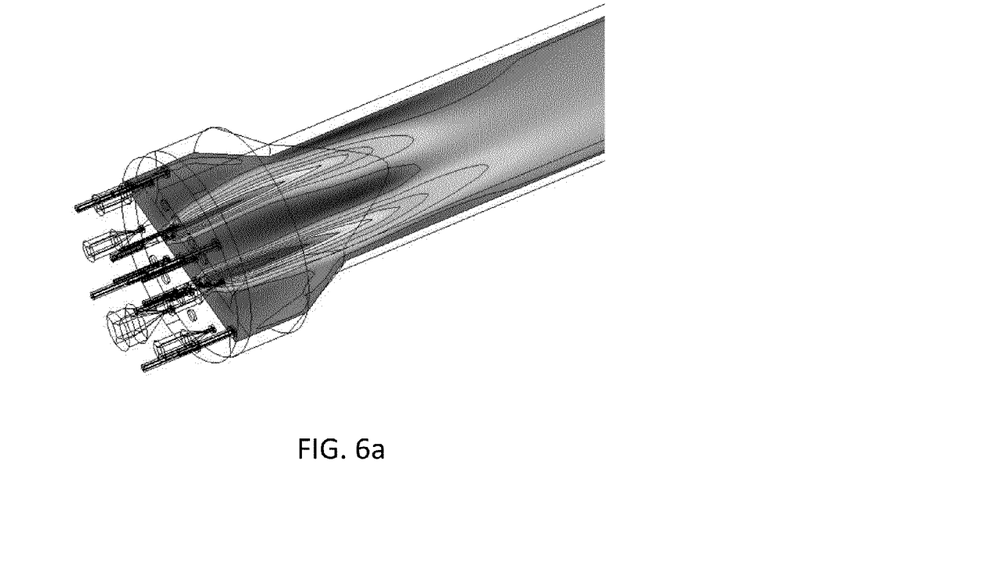
FIG. 6a is an isometric view and FIG. 6b is a side view of the epitaxy chamber components.
Figure 6B:
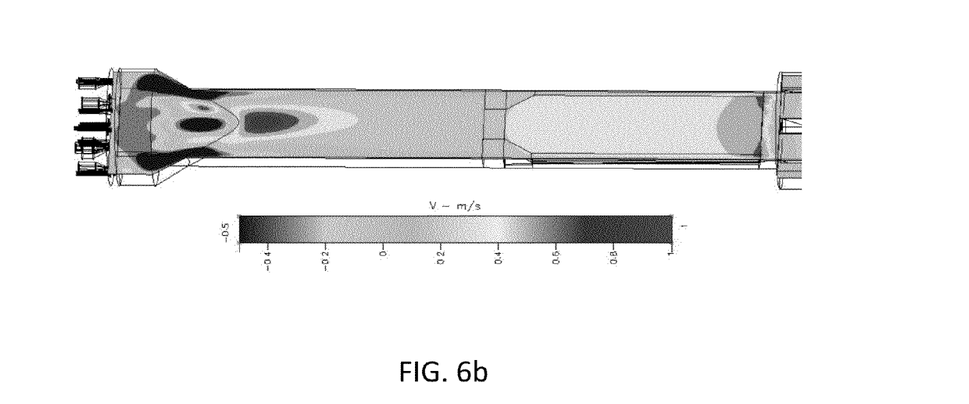

FIG. 6 provides a model of the source end of the growth chamber illustrated in FIG. 4, showing transition from circular to rectangular cross-section going from the source end to the growth zone of the horizontal reactor. The computational fluid dynamics (CFD) model of the gas flow within these components depicted in FIGS. 6a ad 6b show transition of jet and turbulent flows to laminar flow prior to the gas flow exiting the nitrogen precursor insert and reaching the growth zone of the chamber. It is understood that the invention is not limited to this particular furnace configuration as other configurations (e.g., vertical furnaces like that shown in FIG. 2) that offer the required control over the temperature, temperature zone or zones, gas flow, source and substrate location, source configuration, etc., can also be used. The furnace configuration disclosed is preferred for the growth of undoped GaN.

Figure 7:
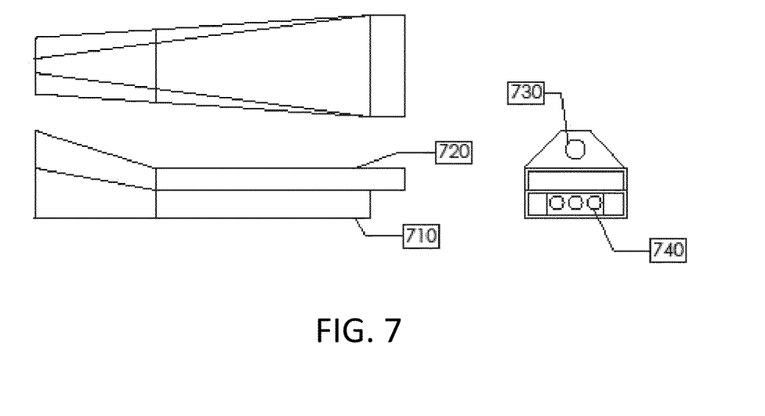
FIG. 7 is a particular example of an insert to separate a nitrogen precursor and GaCl in upstream of reactor. To allow laminar flow, both III-Cl and $NH_3$ Injectors should have low height-to-width ratio.

FIG. 7 illustrates an alternate embodiment of the invention. The particular component illustrated in FIG. 7 combines a nitrogen precursor insert (block 710) with a rectangular channel for group III-precursor flow (block 720) to separate the nitrogen precursor from III-Chlorides in upstream of growth zone. To create a laminar flow, both III-chloride (block 730) and NH$_3$ (block 740) Injectors transition to channels having predominantly rectangular cross-sections with low height-to-width (aspect) ratio. The trapezoidal shape of the channel along its length improves distribution of the precursors in the transverse direction of the reactor. It should be noted that there is no significance to the relative positions of the group III and nitrogen precursor portions of the nitrogen precursor insert; in other words, the group III precursor could be injected below the nitrogen precursor or vice versa. Rather, it is important that the nitrogen precursor insert provide separation of those group III and nitrogen precursors within the source zone. Such integration of the nitrogen precursor insert with adjacent and/or surrounding components is fundamentally compatible with the practice of the invention.

Geometry for transition from the source to the growth zone that predominantly affects III-Cl precursors and dopant gases is invented to control the transition of III-chloride precursor gas flow from complex, multi-jet to laminar shape. Due to the differing space and flow requirements of the source and growth reactor sections, flow from the large, circular cross-section source area containing the source nozzles, is required to be transformed to the smaller, rectangular cross-section. The geometry of transition from cylindrical to rectangular shape through the conical part is used to ensure the laminar gas flow inside the growth zone. For the velocity of flow within an atmospheric pressure reactor to be sufficient, the precursors are injected through the narrow diameter tubing injectors. The reactor quartz geometry is designed to control the transition from jet to laminar flow.

The geometry of the nitrogen precursor inserts predominantly affects the nitrogen precursor delivery in the growth zone. It is designed to separate the nitrogen precursor gas from the III-Cl precursors prior to the mixing at the substrate holder. Premature mixing causes precursor depletion and unwanted parasitic deposition on the reactor walls. Additionally, the design allows delivery of the optimum V-III ratio of the precursors to the wafer surfaces and optimizes the efficiency of use of the precursor gases. It worth noting that employment of the nitrogen precursor insert leads to uniform distribution of the precursor gases over the entire wafer holder area so that uniform thickness distribution over each wafer and across the batch can be obtained. As a positive side effect, spatially directed to the growth zone and to the wafer batch, a nitrogen precursor reduces parasitic deposition of the III-N material on the reactor walls outside the growth zone of the reactor.

Precursor inserts within the gas flow distribution unit are introduced for separation of the reactive components of the gas flow. Employment of the inserts allows increasing growth rate and the precursors' efficiency of use. They also serve as an effective tool in reduction of the parasitic deposition of the GaN on the reactor walls.

The nitrogen precursor insert as well as the III-chloride injectors are the quartz tubes intended to transport a mix of a carrier gas and nitrogen precursor and III-chloride gases to a vicinity of the growth zone in a reactor. In the growth zone the nitrogen precursor reacts with III-chlorides and III-N material deposits on a substrate. The nitrogen precursor insert prevents parasitic reaction in the gas phase between the active gases (nitrogen precursor, Ill-chlorides, and hydrogen chloride) in the source zone and upstream of the substrate in the growth zone of the reactor by separation of injection of the other active gases into the reactor and uniformly directing the flow of precursors across the growth zone. The length, height, and width of the nitrogen precursor insert are optimally adjusted to the position and dimensions of the growth zone to allow beneficial mixing of the active gases close to the substrate to provide controllable growth on the substrates placed on the wafer holder. To be noted as a positive side effect of this adjustment, reduced unnecessary decomposition of the precursors upstream of the growth zone increases the materials consumption (more are delivered to the growth area and deposited on the substrates) and consequently increases the growth rate, lowering the process time. Less parasitic deposition reduces maintenance time for in-situ cleaning of the reactor quartz ware after each epitaxial growth run. Reduced parasitic deposition also facilitates replacement of the reactor quartz parts.

While the foregoing is directed to embodiment of the present invention, other and further embodiments of the invention may be devised without departing from the basic scope thereof, and the scope thereof is determined by the claims of the present invention.

What is claimed is:

1. A gas flow distribution unit between source and growth zone of a hydride vapor phase epitaxy reactor for III-Nitride growth including a nitrogen precursor insert of predominantly rectangular cross-section having an aspect ratio ranging from approximately 0.01 to approximately 0.5 used to transport a mix of a carrier gas and ammonia to the growth zone.

2. The gas flow distribution unit of claim 1, wherein the nitrogen precursor insert is made of quartz.

3. The gas flow distribution unit of claim 1, wherein the nitrogen precursor insert separates injection of active gases into the reactor and directs flow of precursors uniformly across the growth zone to prevent parasitic reaction in a gas phase between ammonia and III-chloride gas upstream of the growth zone.

4. A gas flow distribution unit between source and growth zone of a hydride vapor phase epitaxy reactor for III-Nitride growth comprising a nitrogen precursor insert of predominantly rectangular cross-section having height-to-width ratio ranging from approximately 0.01 to approximately 0.5 to transport a mix of a carrier gas and ammonia to the growth zone, coupled to a III-chloride injectors of predominantly rectangular cross-section having a height-to-width ratio ranging from approximately 0.01 to approximately 0.5 to transport a III-chloride gas to the growth zone.

5. The gas flow distribution unit of claim 4, wherein the nitrogen precursor insert and III-chloride injectors are made of quartz.

6. The gas flow distribution unit of claim 4, wherein the nitrogen precursor insert and III-chloride injectors are of a trapezoidal shape to improve distribution of precursors in transverse direction.

7. The gas flow distribution unit of claim 4, wherein the nitrogen precursor insert separates injection of active gases into the reactor and to the growth zone and directs gas flow of precursors uniformly across the growth zone to prevent parasitic reaction in a gas phase between ammonia and III-chloride gas upstream of the growth zone.

8. The gas flow distribution unit of claim 4 wherein the III-chloride insert transports a mix of a III-chloride gas and a carrier gas to the growth zone.

9. The gas flow distribution unit of claim 4, wherein the III-chloride gas comprises gallium chloride mixed with a carrier gas consisting of nitrogen, argon, and/or hydrogen.

10. The gas flow distribution unit of claim 4, wherein the III-chloride gas comprises aluminum chloride mixed with a carrier gas consisting of nitrogen, argon, and/or hydrogen.

* * * * *